Oct. 24, 1972 | L. A. MURRAY | 3,700,507

METHOD OF MAKING COMPLEMENTARY INSULATED GATE FIELD EFFECT TRANSISTORS

Filed Oct. 21, 1969 | 3 Sheets-Sheet 1

INVENTOR.
LAWRENCE A. MURRAY
BY
Donald S. Cohen
Attorney

INVENTOR.
LAWRENCE A. MURRAY
BY
Donald S. Cohen
Attorney

INVENTOR.
LAWRENCE A. MURRAY
BY Donald S. Cohen
Attorney 3,700,507

METHOD OF MAKING COMPLEMENTARY INSULATED GATE FIELD EFFECT TRANSISTORS

Lawrence Aloysius Murray, Somerville, N.J., assignor to RCA Corporation

Filed Oct. 21, 1969, Ser. No. 868,071
Int. Cl. H01l 7/44, 11/14
U.S. Cl. 148—187 9 Claims

ABSTRACT OF THE DISCLOSURE

The source and drain regions and the channel insulation of two complementary field effect transistors are diffused simultaneously during a single heat treatment so as to reduce the number of heat treatment steps required to make the device. The method may also include diffusing the well region for one of the field effect transistors during the same heat treatment step that the source and drain regions are diffused and the channel insulation is formed so as to further reduce the number of heat treatment steps.

BACKGROUND OF INVENTION

The invention herein disclosed was made in the course of or under a contract or subcontract thereunder with the Department of the Army.

The present invention relates to methods of making complementary insulated gate field effect transistors in a common substrate.

An insulated gate field effect transistor in general comprises a body of semiconductor material, such as silicon, of one conductivity type having herein at one surface thereof spaced regions of the opposite conductivity type, a layer of an insulating material, such as silicon dioxide, on the surface of the body between the spaced regions, and a metal contact layer over the insulating layer. The spaced regions are the source and drain of the transistor and the metal film is the gate contact over the channel of the transistor. For certain applications it is desirable to provide complementary insulated gate field effect transistors in a common substrate of semiconductor material. Complementary insulated gate field effect transistors are two such transistors in which the source and drain regions of one transistor are of a conductivity type opposite to that of the source and drain of the other transistor. Since the source and drain regions of one of the transistors would be of the same conductivity type as that of the substrate, a region or well of a conductivity type opposite to that of the substrate is provided in the substrate. One of the transistors is formed in the well region and the other transistor is formed in the substrate outside of the well region.

The method heretofore used to make complementary insulated gate field effect transistors includes a number of heat treatment steps in order to diffuse impurities into the silicon body to form the well region and the source and drain regions, to form the various silicon oxide layers which serve as diffusion masks and the channel insulation, and to form the metal contacts for the source, drain and channel regions. Each of the added heat treatment steps in the method sequence has an effect on the device which can result in a degradation of the device characteristics and can lead to reliability problems. Also, each extra processing step lengthens the time required to make the device and increases the cost of the device. Therefore it is desirable to have a method of making complementary insulated gate field effect transistors which reduces the number of heat treatment steps required to make the device.

SUMMARY OF INVENTION

A first pair of bounded regions of a material containing an impurity of a first type conductivity and a second pair of bounded regions of a material containing an impurity of a second type conductivity are disposed on a surface of a semiconductor body. The impurities of the two pairs of regions are simultaneously diffused into the body to simultaneously form first and second pairs of source and drain electrodes for the two transistors.

A diffused well in which one of the pair of source and drain electrodes is located may be diffused into the body simultaneously with the diffusion of the source and drain electrodes. This is accomplished by disposing a bounded region of material containing an impurity of the second type conductivity beneath the first pair of bounded regions of material of the first type conductivity.

DETAILED DESCRIPTION

Figure 1:
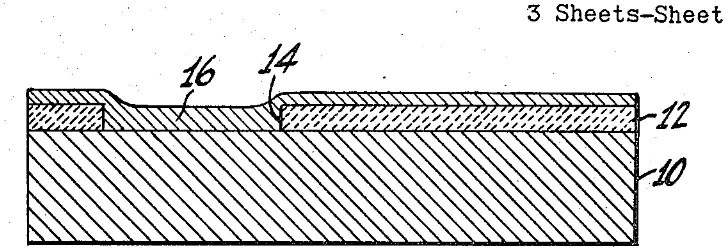
FIGS. 1–7 are sectional views showing the various steps of one method of the present invention for making a pair of complementary insulated gate field effect transistors.

Referring to FIG. 1, to make a pair of complementary insulated gate field effect transistors according to one method of the present invention, one starts with a body 10 of single crystalline silicon of one conductivity type, such as N type. The silicon body 10 can be a flat wafer of the silicon, such as shown in FIG. 1, or it can be a layer of the silicon epitaxially formed on a substrate of silicon or an insulating material, such as sapphire or spinel. A surface of the silicon body 10 is coated with a masking layer 12. The masking layer 12 can be either silicon dioxide, silicon nitride or aluminum oxide. The masking layer 12 can be formed by placing the body 10 in a chamber through which is passed a gas containing the components of the particular material of the masking layer. The chamber is heated to a temperature at which a reaction occurs between the components in the gas to form the particular material of the masking layer which is deposited on the surface of the body 10. If the masking layer 12 is silicon dioxide, the gas may be a mixture of silane and either oxygen or water vapor which are reacted at a temperature of between 200° C. and 400° C. to form a masking layer 12 of silicon nitride the gas may be a mixture of silane and ammonia vapors which react at a temperature of 600° C. to 1200° C. Aluminum oxide can be formed with a gas comprising a mixture of aluminum chloride, carbon dioxide and hydrogen which will react at a temperature above 800° C. Other well known methods for forming the material of the masking layer 12 can also be used. For example, a silicon dioxide layer can be formed by heating the silicon body 10 in an atmosphere containing oxygen at a temperature of between 900° C. and 1200° C. to oxidize the surface of the body.

An opening 14 is then formed through the masking layer 12 to expose a defined area of the surface of the body 10. The opening 14 is formed by coating a resist material over the surface of the masking layer 12 except where the opening 14 is to be provided using standard photolithographic techniques. The uncoated portion of the masking layer 12 is then removed using a suitable etchant. Silicon dioxide can be etched with hydrofluoric acid and silicon nitride and aluminum oxide can be etched with hot phosphoric acid at about 180° C.

The exposed surface of the silicon body 10 within the opening 14 is then coated with a layer 16 of a material containing a dopant of a conductivity type opposite to that of the silicon body 10. Using an N type silicon body 10, the layer 16 may be boron oxide which contains a P type dopant, boron. The boron oxide layer 16 can be formed by placing the silicon body 10 and a disc of boron nitride having a surface coating of boron oxide in an enclosed chamber with the boron nitride disc being positioned adjacent the surface of the body 10 to be coated. The chamber is heated to a temperature of about 820° C. for ½ hour so as to vaporize the boron oxide on the surface of the disc and condense the vapors thereof on the exposed surface of the body 10 as well as over the masking layer 12.

Figure 2:
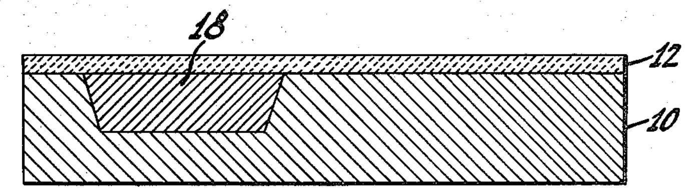

The coated body 10 is then heated at a temperature of about 1200° C. for approximately 16 hours to diffuse the boron in the boron oxide layer 16 into the body 10. As shown in FIG. 2, this forms a P type well region 18 in the body 10 which extends about 10 microns into the body from the surface of the body. The boron oxide layer 16 is then removed with a suitable etchant, such as hydrofluoric acid, and the surface of the body 10 over the well region 18 is coated with a material the same as that of the masking layer 12.

Figure 3:
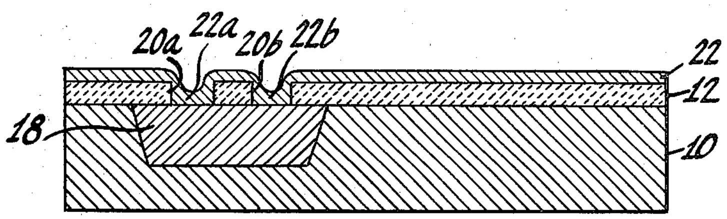

As shown in FIG. 3, a pair of closely spaced openings **20*a* and 20*b* are formed through the masking layer 12 to the surface of the body 10 over the P type well region 18. The openings 20*a* and 20*b* are formed by coating a resist material over the masking layer 12 except where the openings are to be formed. The uncoated areas of the masking layer 12 are then removed using a suitable etchant for the particular material of the masking layer. A layer 22 of a material containing an impurity of the same conductivity type as that of the silicon body 10 is coated over the masking layer 12 and adjacent to, specifically in contact with, the surface of the body 10 exposed at the bottom of the openings 20*a* and 20*b*. With the silicon body 10 being N type conductivity, the layer 22 may be silicon dioxide containing an N type impurity, such as phosphorus. Thus there is provided in the openings 20*a* and 20*b* a pair of bounded regions 22*a* and 22*b* of a material containing an N type conductivity impurity. The layer 22 may be formed by placing the body 10** in a chamber through which is passed a gas containing silicon, oxygen and phosphorus, such as, a mixture of silane, oxygen and phosphine. The chamber is heated to a temperature at which a reaction occurs, between 350° C. and 450° C., to form silicon dioxide containing phosphorus which deposits on the masking layer and the exposed areas of the surface of the body.

Figure 4:
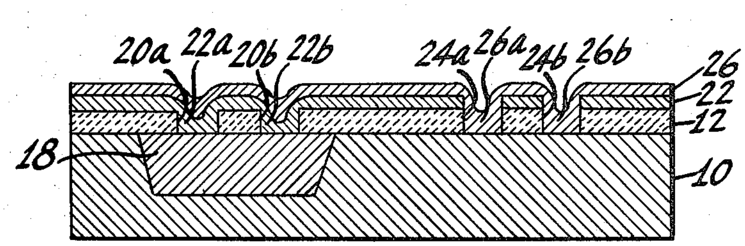

As shown in FIG. 4, a second pair of closely spaced openings **24*a* and 24*b* are formed through the layer 22 and the masking layer 12 to the surface of the body 10 at a position spaced from the well region 18. The openings 24*a* and 24*b* are formed in the same manner that the openings 20*a* and 20*b* were formed. A layer 26 of a material containing an impurity of a conductivity type opposite to that of the silicon body 10 is coated over the layer 22 and adjacent to, specifically in contact with, the surface of the body 10 at the bottom of the openings 24*a* and 24*b*. With the silicon body 10 being N type conductivity, the layer 26 may be silicon dioxide containing a P type impurity, such as boron. Thus there is provided in the openings 24*a* and 24*b* a pair of bounded regions 26*a* and 26*b* of a material containing a P type conductivity impurity. The layer 26 can be formed in the same manner as the layer 22** except that the gas passed through the chamber contains silicon, oxygen and boron, such as a mixture of silane, oxygen and diborane.

Figure 5:
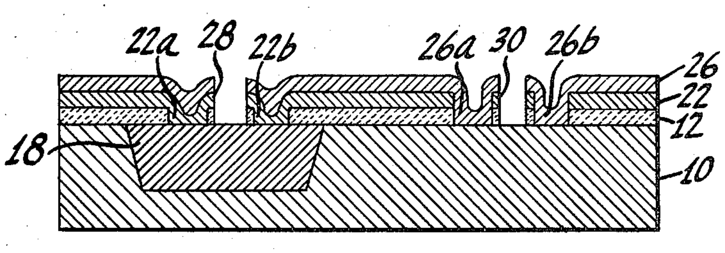
Figure 6:
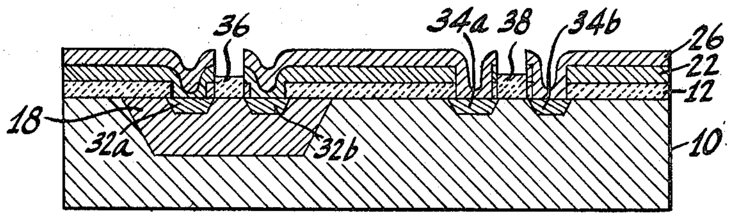

As shown in FIG. 5, the openings 28 and 30 are then formed through the layers 26, 22 and 12 to the surface of the body 10. The opening 28 is positioned between the bounded regions **22*a* and 22*b* and the opening 30 is positioned between the bounded regions 26*a* and 26*b*. The openings 28 and 30 can be formed in the same manner as the openings 20*a*, 20*b*, 24*a* and 24*b*. The body 10 is then heated at a temperature of approximately 1100° C. for about 15 minutes to diffuse the phosphorus from the bounded regions 22*a* and 22*b* and the boron from the bounded regions 26*a* and 26*b* into the body 10. As shown in FIG. 6, the phosphorus diffusion forms the N type source and drain electrodes 32*a* and 32*b* of one field effect transistor in the P type well region 18, and the boron diffusion forms the P type source and drains electrodes 34*a* and 34*b* of a complementary field effect transistor in the body 10 outside of the well region 18. During the last 10 minutes of the diffusion heat treatment oxygen is admitted to the atmosphere around the body 10. This oxidizes the areas of the surface of the body 10 exposed at the bottom of the openings 28 and 30 so as to form the channel insulation layers 36 and 38** of silicon dioxide for the field effect transistors.

Figure 7:
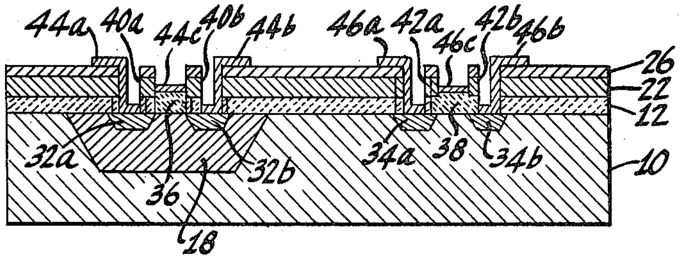

As shown in FIG. 7, a pair of spaced openings **40*a* and 40*b* are formed through the layers 26 and 22 to the surface of the body 10 at the N type source and drain electrodes 32*a* and 32*b* respectively. A second pair of spaced openings 42*a* and 42*b* are formed through the layers 26 and 22 to the surface of the body 10 at the P type source and drain electrodes 34*a* and 34*b* respectively. The openings 40*a*, 40*b*, 42*a* and 42*b* can be etched through the layers 26 and 22** in the manner previously described with regard to the other openings formed through the layers.

A film of an electrically conductive metal, such as aluminum, is coated, such as by evaporation in a vacuum, on the layer 26, the surfaces of the openings **40*a*, 40*b*, 42*a* and 42*b* and the channel insulating layers 36 and 38. Portions of the metal film are removed, such as by chemical etching, to leave contacts 44*a* and 44*b* for the source and drain electrodes and the gate contact 44*c* over the channel of one of the field effect transistors and contacts 46*a* and 46*b* for the source and drain electrodes and the gate contact 46*c*** over the channel of the other field effect transistor. The metal film may be defined to provide interconnecting strips between certain of the contacts of the two complementary field effect transistors depending on the circuit arrangement that the transistors are to be used in.

Thus, in this method of making complementary insulated gate field effect transistors the source and drain electrodes and the channel insulation of both of the complementary field effect transistors are formed simultaneously during a single heat treatment. This reduces the number of heat treatment steps required to make the device so as to reduce the possible effects which can cause degradation of the characteristics of the device. Also, the time necessary to make the device is reduced so as to reduce the cost of making the device.

Figure 8:
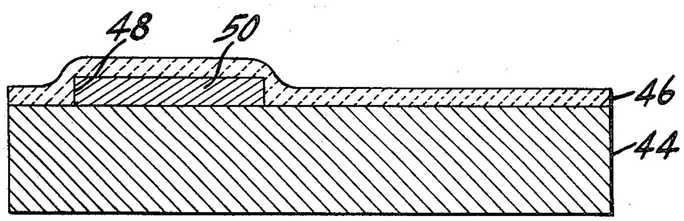
FIGS. 8–13 are sectional views showing the various steps of another method of the present invention for making a pair of complementary insulated gate field effect transistors.

Referring to FIGS. 8–13 there is shown the steps of another method for making complementary insulated gate field effect transistors which further reduces the number of heat treatment steps required. For this method one starts with a body of single crystalline silicon of one conductivity type, such as N type. As shown in FIG. 8, a surface of the body 44 is coated with a masking layer 46, which can be silicon oxide, silicon nitride or aluminum oxide, and an opening 48 is formed through the masking layer 46 to expose a defined area of the surface of the body 44. The masking layer 46 and the opening 48 therethrough can be formed in the manner previously described.

The exposed surface of the silicon body 44 within the opening 48 is then coated with a layer 50 of a material containing a dopant of a conductivity type opposite to that of the silicon body 44. Using an N type silicon body 44, the layer 50 may be silicon dioxide containing P type dopant, such as boron. The layer 50 may be formed by placing the body 44 in a chamber through which is passed a gas containing silicon, oxygen and boron, such as a mixture of silane, oxygen and diborane. The chamber is heated to a temperature at which a reaction occurs, between 300° C. and 450° C. to form silicon dioxide containing boron which deposits on the masking layer 46 and the exposed surface of the silicon body 44. The portion of the layer 50 on the masking layer 46 is then removed leaving only the portion on the surface of the body 44 within the opening 48 in the masking layer 46. This is achieved by applying a film of a resist material over the portion of the layer 50 within the opening 48 and etching away the uncovered portion of the layer 50 with a suitable etchant, such as an aqueous solution of hydrofluoric acid buffered with ammonia fluoride. After the resist material is removed, the remaining portion of the layer 50 is then coated with the same material as that of the masking layer 46 as shown in FIG. 8.

Figure 9:
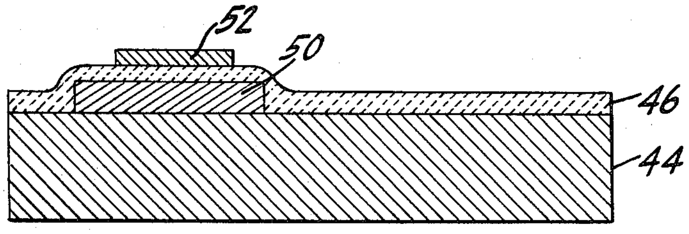

As shown in FIG. 9, a layer 52 of a material containing an impurity of the same conductivity type as that of the silicon body 44 is disposed adjacent to the body 44, specifically it is coated on the masking layer 46 over the layer 50. With the silicon body 44 being of N type conductivity, the layer 52 may be silicon dioxide containing an N type impurity, such as phosphorus. The layer 52 is of an area smaller than the area of the layer 50 and can be formed in the same manner as the layer 50 except that the gas passed through the chamber contains silicon, oxygen, and phosphorus, such as a mixture of silane, oxygen and phosphine. This will coat the entire surface of the masking layer 46 with the phosphorous containing silicon dioxide. A resist material is then coated over the portion of the layer 52 to be retained, and the uncovered portion is removed by a suitable etchant, such as the buffered hydrofluoric acid. After the etching, the resist material is removed.

Figure 10:
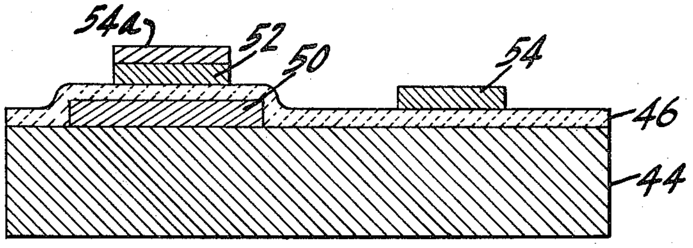

As shown in FIG. 10, a layer 54 of a material containing an impurity of a conductivity type opposite to that of the silicon body 44 is coated on the masking layer 46 spaced from the layer 50. With the silicon body 44 being of N type conductivity, the layer 54 may be silicon dioxide containing a P type impurity, such as boron. The layer 54 is of an area equal to the area of the type conductivity layer 52. The layer 54 can be formed in the same manner as the P-type conductivity layer 50 except that the layer 54 should contain a higher concentration of the P type impurity than is contained in the layer 50. This will coat the entire surface of the masking layer 46 and the N type conductivity layer 52 with the boron containing silicon dioxide. A resist material is coated over the portion of the layer of the boron containing silicon dioxide which form the layer 54 and over the portions which is over the layer 52. The uncovered portion is then removed with an etchant, such as buffered hydrofluoric acid. This leaves the layer 54 as well as a layer **54*a* of the boron containing silicon dioxide over the layer 52. As will be explained, the layer 54*a* will form no part of the insulated gate field effect transistor but is retained so as to prevent etching away any of the layer 52 during the formation of the layer 54. The resist material over the layers 54 and 54*a*** is then removed.

Figure 11:
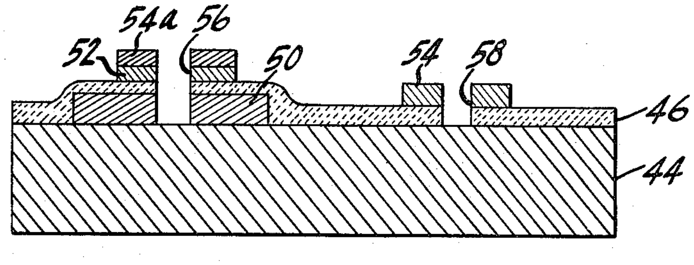

As shown in FIG. 11, an opening 56 is formed through the layers **54*a*, 52, the masking layer 46 and the layer 50 to the surface of the silicon body 44. A second opening 58 is formed through the layer 54 and the masking layer 46 to the surface of the silicon body 44. The openings 56 and 58 are formed simultaneously by coating a resist material over the surfaces of the masking layer 46 and the layers 54 and 54*a* except where the openings are to be provided. The uncoated material is then removed by an etchant, such as the buffered hydrofluoric acid. After the openings 56 and 58 are formed, the resist material is removed. The openings 56 and 58 extend completely across the layers 52 and 54** so as to provide a pair of bounded regions of a material containing an N type conductivity impurity and a pair of bounded regions of a material containing a P type conductivity impurity.

Figure 12:
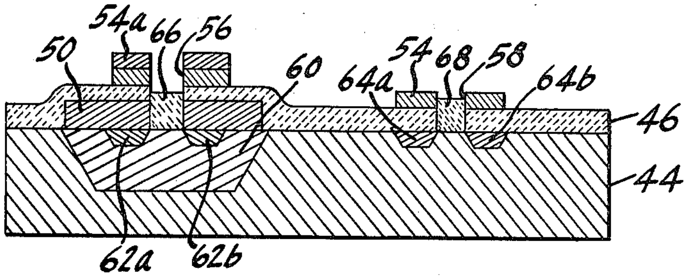

The silicon body 44 is then heated in an inert atmosphere, such as nitrogen, for approximately one hour at a temperature of approximately 1100° C. As shown in FIG. 12, this diffuses the boron from the layer 50 into the silicon body 44 to form a P type well region 60 in the body 44. Simultaneously, the phosphorus from the regions of the layer 52 diffuses through the masking layer 46 and the layer 50 into the silicon body 44 to form the N type source and drain electrodes **62*a* and 62*b* of one field effect transistor in the well region 60. Also at the same time the boron from the regions of the layer 54 diffuses through the masking layer 46 into the silicon body 44 to form the P type source and drain electrodes 64*a* and 64*b* of a complementary field effect transistor in the body 44 outside of the well region 60. Since boron has a diffusion rate which is lower than that of phosphorus and is further removed from the body 44, the boron from the layer 54*a* will not reach the body 44 and will have no effect on the formation of the complementary field effect transistors. During the last 10 minutes of the diffusion heat treatment oxygen is admitted to the atmosphere around the body 44. This oxidizes the areas of the surface of the body 44 exposed at the bottoms of the openings 56 and 58 to form the channel insulation layers 66 and 68** of silicon dioxide for the field effect transistors.

Figure 13:
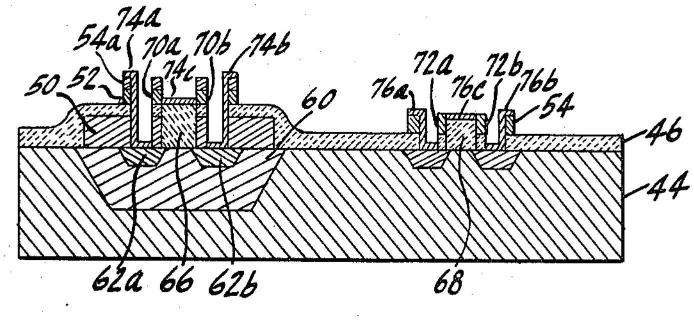

As shown in FIG. 13, a pair of spaced openings **70*a* and 70*b* are formed through the layers 54*a*, 52, 46 and 50 to the surface of the silicon body 44 at the N type source and drain electrodes 62*a* and 62*b* respectively. A second pair of spaced openings 72*a* and 72*b* are formed through the layers 54 and 46 to the surface of the silicon body 44 at the P type source and drain electrodes 64*a* and 64*b* respectively. The openings 70*a*, 70*b*, 72*a* and 72*b* can be etched through the layers in the manner previously described with regard to the other openings formed through the layers. Metal film contacts 74*a*, 74*b* and 74*c* are provided in the source and drain openings 70*a* and 70*b* and over the channel insulation 66 of one of the field effect transistors, and metal film contacts 76*a*, 76*b* and 76*c* are provided in the source and drain openings 72*a* and 72*b* and over the channel insulation 68** of the complementary field effect transistor. The metal film contacts can be formed in the manner previously described with regard to FIG. 7.

Thus, in this method of making complementary insulated field effect transistors the well region as well as the source and drain regions and the channel insulation layers of both of the complementary field effect transistors are formed simultaneously during a single heat treatment. This further reduces the number of heat treatment steps required to make the complementary insulated gate field effect transistor.

I claim:

1. In a method of making a pair of complementary insulated gate field effect transistors in a body of silicon of one conductivity type having therein at a surface thereof a well region of the opposite conductivity type the steps of (a) depositing adjacent said surface of the body over the well region a pair of closely spaced bounded regions of an oxide containing an impurity of said one conductivity type, (b) depositing adjacent said surface of the body spaced from said well region a pair of closely spaced bounded regions of an oxide containing an impurity of said other conductivity type, (c) exposing said surface of the body between the bounded regions of each pair of bonded regions, and then (d) heating said body in an oxidizing atmosphere so as to simultaneously diffuse the impurities of said pairs of regions into the body to a depth less than the depth of the well region and form a layer of silicon dioxide on the exposed surface of the body between the pairs of bounded regions so as to simultaneously form the source and drain electrodes and the channel insulation of two insulated gate field effect transistors.

2. The method of claim 1 in which the pairs of bounded regions are formed by first providing a masking layer on the said surface of the body, forming a first pair of closely spaced openings through said masking layer to said surface of the body at the well region, forming a second pair of closely spaced openings through said masking layer to said surface of the body spaced from the well region, depositing the first pair of bounded regions in said first pair of openings in the masking layer and depositing the second pair of bounded regions in said second pair of openings in the masking layer.

3. The method of claim 2 in which the first pair of openings through the masking layer are formed first, then a first layer of an oxide containing the impurity of the one conductivity type is deposited on the masking layer and in said first pair of openings to form said first pair of bounded regions, then said second pair of openings are formed through said first layer and the masking layer, and then a second layer of an oxide containing the impurity of the opposite conductivity type is deposited on said first layer and in said second pair of openings to form said second pair of bounded regions.

4. A method in accordance with claim 3 in which after the second layer is deposited, a separate opening is formed through the layers to the surface of the body between each pair of bounded regions, and the silicon dioxide layers are formed in said openings.

5. A method in accordance with 1 in which the well region is formed in the body simultaneously with the source and drain regions by depositing on said surface of the silicon body between said surface and the first pair of bounded regions a third bounded region of an oxide containing an impurity of the opposite conductivity type and diffusing the impurity from the third bounded region into the body simultaneously with the diffusion of the impurities from the pairs of bounded regions.

6. A method in accordance with claim 5 in which prior to depositing the bounded regions a masking layer is provided on the said surface of the silicon body, an opening is formed through the masking layer to the surface of the body, the third bounded region is deposited on the surface of the body within the opening in the masking layer, the first pair of bounded regions is deposited on the third bounded region and the second pair of bounded regions is deposited on the masking layer spaced from the third bounded region.

7. The method of claim 6 in which prior to depositing the first pair of bounded regions the third bounded region is coated with the material of the masking layer and the first pair of bounded regions are deposited on the masking layer over the third bounded region.

8. The method of claim 7 in which the pairs of bounded regions are formed by first depositing a layer of an oxide containing an impurity of the one conductivity type over the surface of the masking layer, then removing the material of said layer except for an area over the third bounded region which is smaller than the area of the third bounded region, then depositing a second layer of an oxide containing an impurity of the opposite conductivity type on the masking layer and the remaining area of the first layer, and then removing the material of said second layer except for an area over the remaining area of the first layer and an area of the same size spaced from the third bounded region.

9. The method of claim 8 in which after the areas of the second layer are formed and prior to diffusing the impurities into the body a first opening is formed through the overlapping areas of the second layer, the first layer, the masking layer and the third bounded region to the surface of the body which opening extends across the area of the first layer to form the first pair of bounded regions, and a second opening is formed through the other area of the second layer and the masking layer to the surface of the body which opening extends across the area of the second layer to form the second pair of bounded regions.

References Cited

UNITED STATES PATENTS

| | | | |
|---|---|---|---|
| 3,177,100 | 4/1965 | Mayer et al. | 148—175 |
| 3,387,358 | 6/1968 | Heiman | 29—571 |
| 3,309,245 | 3/1967 | Haenichen | 148—187 |
| 3,356,858 | 12/1967 | Wanlass | 317—235 X |
| 3,089,794 | 5/1963 | Marinace | 148—1.5 |
| 3,450,961 | 6/1969 | Tsai | 317—235 |
| 3,514,845 | 6/1970 | Legat et al. | 29—571 |
| 2,804,405 | 8/1957 | Derick et al. | 148—188 X |
| 3,070,466 | 12/1962 | Lyons | 148—188 X |
| 3,287,187 | 11/1966 | Rosenheinrich | 148—187 |
| 3,391,035 | 7/1968 | Mackintosh | 148—187 |
| 3,566,518 | 3/1971 | Brown et al. | 29—571 |

OTHER REFERENCES

Carlsen, G. S., "Multiple Diffusion for Integrated . . . Diffusion," IBM Tech. Discl., Bull., vol. 9, No. 10, March 1967, pp. 1456–1458.

L. DEWAYNE RUTLEDGE, Primary Examiner

W. G. SABA, Assistant Examiner

U.S. Cl. X.R.

29—571; 148—188, 190; 317—235 R

UNITED STATES PATENT OFFICE
CERTIFICATE OF CORRECTION

Patent No. 3,700,507 Dated October 24, 1972

Inventor(s) Lawrence Aloysius Murray

It is certified that error appears in the above-identified patent and that said Letters Patent are hereby corrected as shown below:

Column 5, line 39, before "type" insert --N--.

Column 6, line 66, change "bonded" to --bounded--.

Signed and sealed this 3rd day of April 1973.

(SEAL)
Attest:

EDWARD M.FLETCHER,JR.
Attesting Officer

ROBERT GOTTSCHALK
Commissioner of Patents